United States Patent [19]

Aoki et al.

[11] 4,175,317

[45] Nov. 27, 1979

[54] METHOD FOR MANUFACTURING JUNCTION TYPE FIELD-EFFECT TRANSISTORS

[75] Inventors: Kiyoshi Aoki; Hisao Kamo, both of Yokohama, Japan

[73] Assignee: Tokyo Shibaura Electric Co., Ltd., Kawasaki, Japan

[21] Appl. No.: 853,868

[22] Filed: Nov. 22, 1977

[30] Foreign Application Priority Data

Nov. 24, 1976 [JP] Japan ................................ 51/140214

[51] Int. Cl.$^2$ ........................................... B01J 17/00
[52] U.S. Cl. ........................................ 29/571; 29/578; 357/22

[58] Field of Search .................... 29/571, 578, 580; 357/22

[56] References Cited

U.S. PATENT DOCUMENTS 4,041,517  8/1977  Fuse ...................................... 357/22

Primary Examiner—W. C. Tupman
Attorney, Agent, or Firm—Oblon, Fisher, Spivak, McClelland & Maier

[57] ABSTRACT

In a method for manufacturing a junction type field-effect transistor, there is formed a gate region having one portion over which a source electrode extends and the other portion which allows an essential gate function. These portions are formed by diffusing impurities through openings of different masks.

10 Claims, 21 Drawing Figures

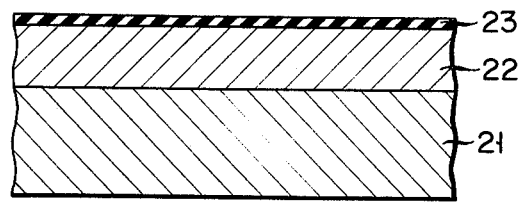
F I G. 2A
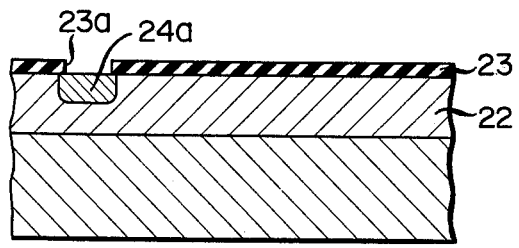
F I G. 2B
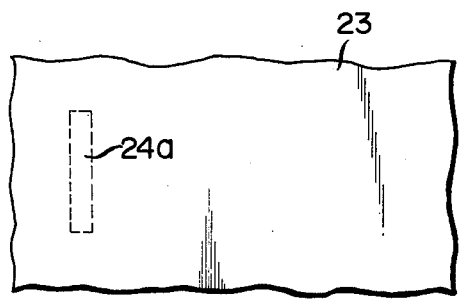
F I G. 2C
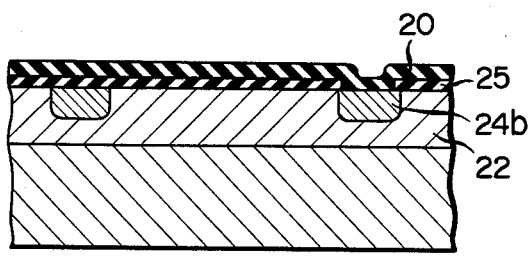
F I G. 2D
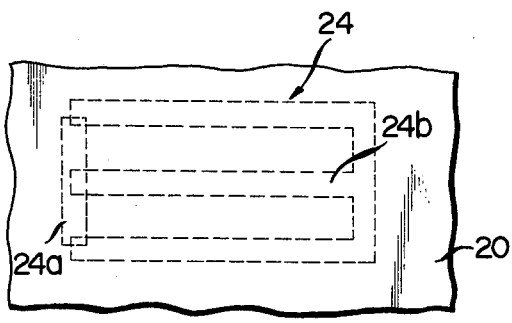
F I G. 2E

METHOD FOR MANUFACTURING JUNCTION TYPE FIELD-EFFECT TRANSISTORS

BACKGROUND OF THE INVENTION

This invention relates to a method for manufacturing a junction type field-effect transistor (longitudinal-type FET) with a longitudinally extended channel.

The prior art transistors of this kind are so formed as shown in FIGS. 1A to 1F, for example, while there will be described in brief the method for manufacturing such transistors.

First, an n-type silicon layer 12 with a low impurity concentration is formed on an n+-type silicon substrate 11 forming a drain region, by the epitaxial growth method, and the surface of the layer 12 is oxidized to form a silicon oxide film 13 as shown in FIG. 1A. Then, a part of the film 13 is selectively removed to expose reticulately the n-type silicon layer 12, where a p-type impurity, such as boron, is diffused to form in the silicon layer 12 a p+-type layer 14 with a high impurity concentration to form a gate region as shown in FIG. 1B. After completely removing the mask of silicon oxide film 13 from the surface of the silicon layer 12, another silicon oxide film 15 is newly formed on the layer 12. Subsequently, portions of the silicon oxide film 15 surrounded by the gate region 14 are each removed in the shape of a strip, and an n-type impurity, such as arsenic, is diffused through the removed portions, that is, with the silicon oxide film 15 used as a mask, thereby forming in the surface of the n-type silicon layer 12 n+-type layers 16 with a high impurity concentration to form a source region as shown in FIG. 1C. A portion of the silicon oxide film 15 on the gate region 14 is selectively etched and removed, and gate electrodes 14a and source electrodes 16a, as shown in FIG. 1D, are formed on the gate region 14 and source regions 16 through the removed portions or openings for forming the source region, respectively. In thus manufactured semiconductor device, as shown in FIG. 1E or plan view of such device, the gate electrodes 14a and the source electrodes 16a are formed in the shape of combs engaging each other. Further, also on the drain region 11 is formed an electrode 11a as shown in FIG. 1D.

In the method for manufacturing longitudinal-type FET's as described above, as regards the formation of the source region 16, an opening in the oxide film for diffusion is identical with one for the takeout of the electrodes, so that its width can be reduced to the minimum size for boring. As regards the gate region 14, however, the oxide film 15 must be newly formed after diffusing the impurity for forming the region 14, requiring further formation of an opening for the takeout of the electrodes in the oxide film by the photoetching method. That is, the opening in the oxide film for forming the region 14 is separate from the opening for the takeout of the electrodes. Therefore, the first opening for diffusion must be wider by a degree corresponding to the error in opening location (mask alignment error). If the minimum size for boring is 1.5 $\mu$m and the mask alignment error is $\pm 1.0$ $\mu$m, for example, the opening in the source region 16 may be 1.5 $\mu$m wide, though the opening in the gate region 14 should be at least 3.5 $\mu$m wide. Accordingly, the area of the gate region 14 is increased and thus the gate-drain capacitance grows larger, thereby deteriorating the high-frequency characteristic. Further, in view of compactification and higher integration, it is not to be desired that the gate region 14 must be widened unnecessarily.

SUMMARY OF THE INVENTION

An object of this invention is to provide a method for manufacturing junction field-effect transistors requiring no unnecessarily large area of gate region, thus reducing the capacitance between the gate and drain, and improving the high-frequency characteristic.

BRIEF DESCRIPTION OF THE DRAWING

FIGS. 2A to 2I are process diagrams for illustrating the method for manufacturing the FET according to an embodiment of this invention, wherein FIGS. 2C, 2E, 2G and 2I are plan views of FIGS. 2B, 2D, 2F and 2H, drawn schematically, respectively;

DETAILED DESCRIPTION OF THE PREFERRED EMBODIMENT

Now I will describe the method of manufacturing longitudinal-type FET's according to an embodiment of this invention with reference to FIGS. 2A to 2I.

Figure 1A:
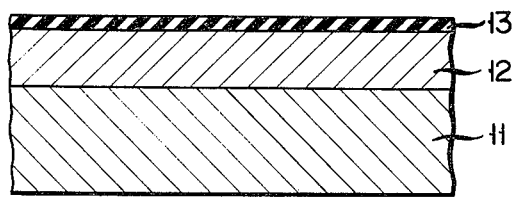
FIGS. 1A to 1E are process diagrams for illustrating the conventional method for manufacturing a longitudinal type FET, wherein FIG. 1E alone is a plan view of FIG. 1D.
Figure 1B:
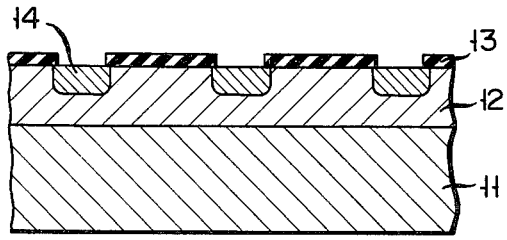
Figure 1C:
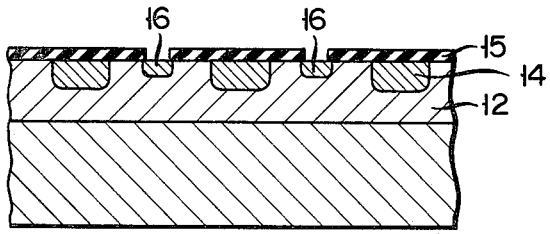
Figure 1D:
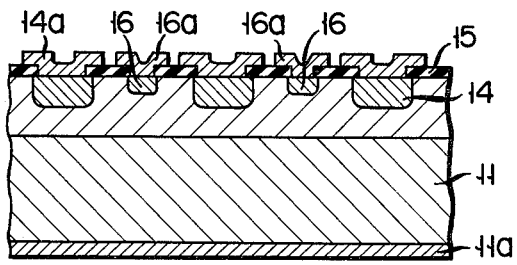
Figure 1E:
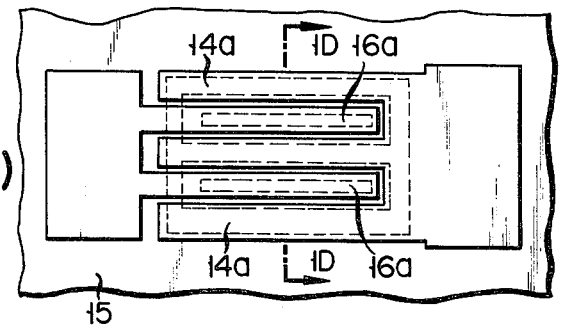
Figure 2F:
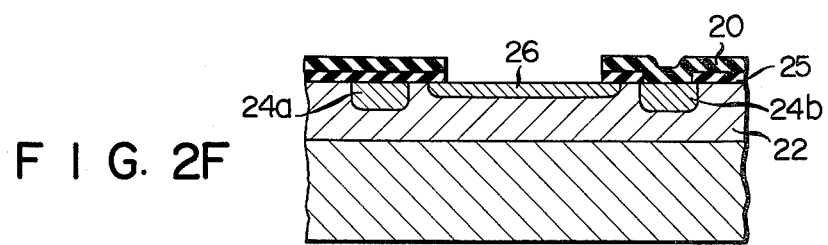
Figure 2G:
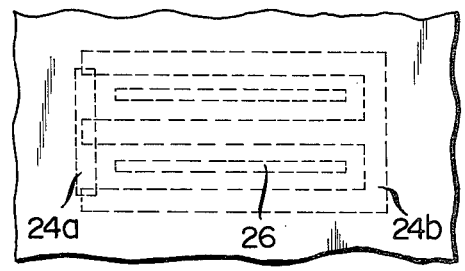
Figure 2H:
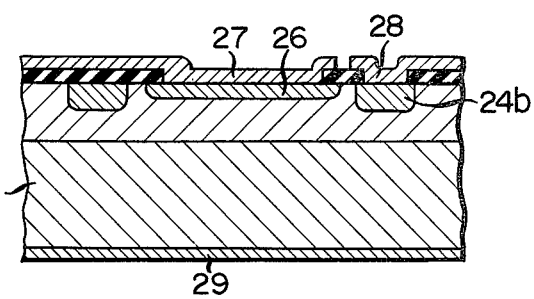
Figure 2I:
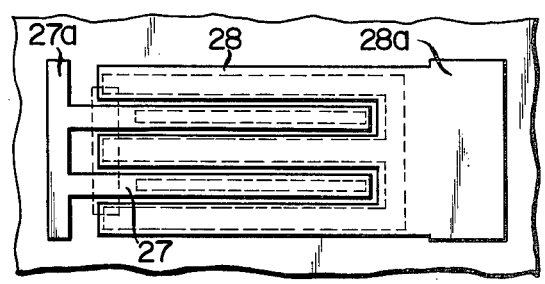

An n-type silicon layer 22 approximately 5 $\mu$m thick with a low impurity concentration (e.g., as low as $1 \times 10^{15} cm^{-3}$) is formed on an n+-type silicon substrate 21 approximately 200 $\mu$m thick with a high impurity concentration constituting a drain region by the epitaxial growth method. The surface of the silicon layer 22 is oxidized to form a silicon dioxide film 23 with a thickness of approximately 3,000 Å as shown in FIG. 2A. Then, a part of the film 23 is removed laterally in the shape of a strip to form an opening 23a and expose a part of the silicon layer 22. With the film 23 used as a mask, a p-type impurity, such as boron, is diffused into the silicon layer 22 to form a p+-type layer 24a with a high impurity concentration forming a part of a gate region as shown in FIGS. 2B and 2C. The p+-type layer 24a is to intersect a source electrode layer as formed afterwards through an insulating layer (silicon dioxide layer). Thereafter, the oxide film 23 is all removed from the surface of the silicon layer 22, and another silicon dioxide film 25 is newly formed on the exposed top face of the silicon layer 22. A part of the oxide film 25 is selectively etched and removed in the shape of a turned letter-E with end portions located over or near the p+-type layer 24a, thereby exposing a part of the silicon layer 22. On the oxide film 25, as well as on the exposed portion of the silicon layer 22, is formed a boron-doped silicon oxide (BSG) film 20, which is heated to diffuse the boron doped in the film 20 into the silicon layer 22 through the removed portion of the oxide film 25, thus forming a turned E-shaped p+-type layer 24b with its end portions overlapping the p+-type 24a as shown in FIGS. 2D and 2E. This p+-type layer 24b and the aforesaid p+-type layer 24a form a grid-shaped gate region 24. Subsequently, portions of both said oxide films 20 and 25 surrounded by the gate region 24 are each selectively removed in the form of a strip to expose the silicon layer 22. An n-type impurity, such as As, is diffused into the silicon layer 22 through these removed portions, thereby forming n- type layers 26 with a high impurity concentration (at $10^{19}$cm$^{-3}$ and above) to form a source region, as shown in FIGS. 2F and 2G. The n-type layer 26 is surrounded by the gate region 24 through a portion of the silicon layer 22. Then, the BSG layer 20 is removed from the surface of the oxide film 25 and the p+-type layer 24b, and source electrodes 27 and gate electrodes 28, as shown in FIGS. 2H and 2I, are formed on the whole surface of the source region 26 and the portion 24b of the gate region, respectively. The source electrodes 27 extend across the portion 24a of the gate region through the oxide film 25 and are connected to a common electrode pat 27a. The gate electrodes 28 extend opposite to the source electrodes and are connected to a common electrode pat 28a. In FIG. 2H numeral 29 denotes a drain electrode attached to the bottom face of the drain region 21.

In the above-mentioned manufacturing method, an opening for forming the portion 24b of the gate region is also used for forming the gate electrodes 28, so that the diffusion width of the larger portion 24b of the gate region may be reduced to substantially the same width as that of the source region. Therefore, the semiconductor device with such a narrow gate region may have a reduced capacitance as well as a surpassing high-frequency characteristic.

Now I will describe the manufacturing method according to another embodiment of the invention with reference to FIGS. 3A to 3G.

Figure 3A:
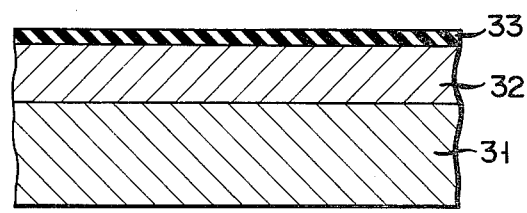
FIGS. 3A to 3G are diagrams for illustrating the method of an alternative embodiment in sequence of process.
Figure 3B:
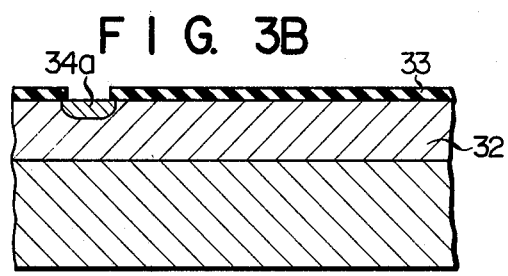
Figure 3C:
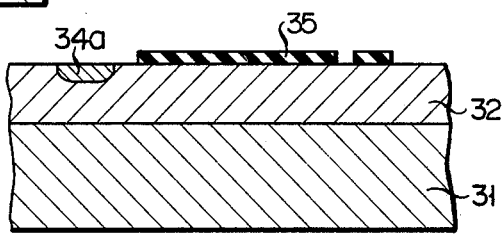
Figure 3D:
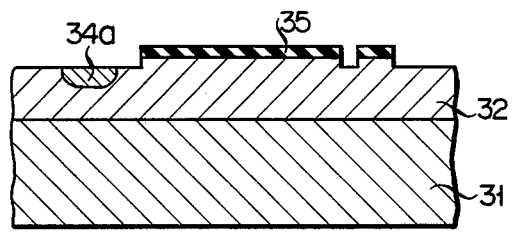
Figure 3E:
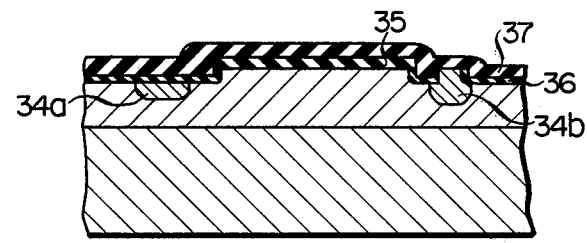
Figure 3F:
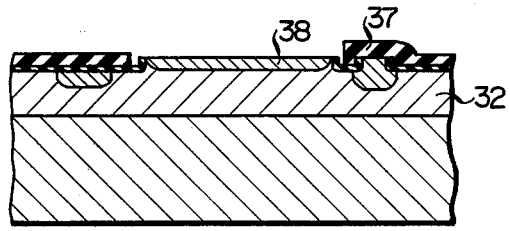
Figure 3G:
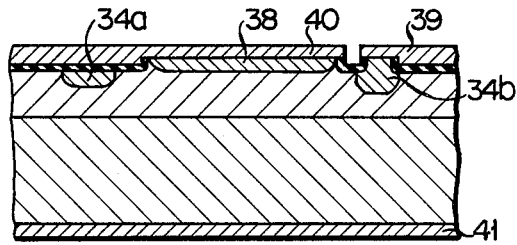

In the same manner as in the aforementioned embodiment, an n-type silicon layer 32 with a low impurity concentration is formed on an n+-type silicon substrate 31 constituting a drain region by the epitaxial growth method, and then the surface of the silicon layer 32 is oxidized to form a silicon oxide film 33 with a thickness of 3,000 Å as shown in FIG. 3A. A part of the oxide film 33 is removed in the shape of a strip to expose the corresponding portion of the silicon layer 32. With the oxide film 33 used as a mask, a mask, a p-type impurity, such as boron, is diffused into the silicon layer 32 to form a p+-type layer 34a forming a part of the gate region as shown in FIG. 3B. Thereafter, the oxide film 33 is all removed from the surface of the silicon layer 32, and a silicon nitride film (Si$_3$N$_4$ film) 35 is evaporated all over the surface of the layer 32. Then, the parts of the Si$_3$N$_4$ film 35 on the portions other than a source region and a second p+-type layer to form a gate region together with the first p+-type layer 34a are etched and removed from the surface of the silicon layer 32 as shown in FIG. 3C. With the Si$_3$N$_4$ film 35 used as a mask, the exposed surface of the silicon layer 32, including the top face of the first p+-type layer 34a, is etched to a depth of approximately 0.3 μm as shown in FIG. 3D. Subsequently, the portion scraped off by the etching is oxidized to form selectively an SiO$_2$ film 36 over the silicon layer 32, and then the portion of the Si$_3$N$_4$ film 35 over the portions other than the portion to form the source region afterwards is etched and removed. Consequently, the silicon layer 32 is exposed in the shape of a letter-E in which the second p+-type layer is to be formed afterwards. On the insulating films 35 and 36, as well as on the exposed portion of the silicon layer 32, is evaporated a boron-doped silicon oxide film (BSG film) 37, which is heated to diffuse the boron-doped in the BSG film 37 into the silicon layer 32, thereby forming a second p+-type layer 34b as shown in FIG. 3E. The second p+-type layer 34b is letter-E shaped and forms the gate region of a closed shape together with the strip-shaped first p+-type layer 34a. Then, portions of the insultating films 35 and 37 surrounded by the gate region are removed in the shape of a strip to expose the silicon layer 32 partially. An n-type impurity, such as As, is diffused into the silicon layer 32 through these removed portions, thereby forming n+-type layers 38 to form the source region, as shown in FIG. 3F. Further, the BSG layer 37 on the second p+-type layer 34b of the gate region is removed to expose the layer 34b, and gate electrodes 39 and source electrodes 40, as shown in FIG. 3G, are formed on the layer 34b of the gate region and the source region 38, respectively. A drain electrode 41 is attached to the bottom face of the substrate 31 before or after the process for forming the source and drain electrodes, thus completing the longitudinal-type FET.

In the above-mentioned manufacturing method, the gate region is composed of a first portion over and across which the source electrodes extend and a second portion practically functioning as a gate, these portions being formed in different processes. The first portion has a function of only preventing an uncontrolled current from flowing in laterally. Therefore, the diffusing processes for forming the respective portions need not be conducted under the same condition, allowing different diffusing means, kinds of impurities, concentrations, and depths of diffusion. For example, the impurity concentration of the gate region is usuallly given at a substantially high level (approximately $1 \times 10^{20}$cm$^{-3}$), though there is not required very high concentration for the first diffusion, that is, for the first portion. In the method of the second embodiment, if a high concentration is used in the first diffusion and the silicon is etched by means of the well-used mixed solution of hydrofluoric acid, nitric acid, and acetic acid, then the etching speed will be increased for the diffused portion alone to cause a difference in level between such diffused portion and the silicon layer, bringing about unfavorable results. Accordingly, the impurity concentration of the first portion of the gate region should preferably be lower than that of the second portion by one place. For a high frequency element, the space between the gate and the drain is often reduced to the very limit for the required resisting voltage. If the first diffusion is made too deep as compared with the second one, the space between the gate and the drain will be reduced unduly to lower the resisting voltage. Thus, the first diffusion should preferably be made a little shallower than the second diffusion.

Although in both of the above-mentioned embodiments the BSG film is used as the second gate diffusion source, there may be also used boron nitride (BN) or the ion implantation method for that purpose. In such cases, however, the surface of the gate region should preferably be covered with BSG or other substance capable of being removed by etching without damaging the oxide film lest the impurity should be diffused also into the gate region at the later diffusing process for forming the source region. Nevertheless, because the source diffusion is made substantially shallower than the gate diffusion, there will be caused no substantial adverse effects if the n-type impurity is diffused more or less into a part of the gate region due to incomplete masking effect. The gate impurity is not limited to boron and there may be also used gallium and the like.

In the manufacturing method of the second embodiment, it is to be desired that an SiO$_2$ film as thin as 500 to 1,000 Å is formed between the Si$_3$N$_4$ film and the silicon layer in order to prevent the silicon layer from being distorted by the difference in the coefficient of thermal expansion between such film and layer. In this embodiment, the surface of the silicon layer is not necessarily required to be etched.

Although illustrative embodiments of this invention have been described in detail herein with reference to the FET with n-type channels alone, those with p-type channels may be also effected by one skilled in the art without departing from the scope or spirit of the invention. In this case, phosphorus-doped oxide or arsenic-doped oxide may suitably be used as the gate diffusion source.

What we claim is:

1. A method for manufacturing a junction field-effect transistor comprising a first step for preparing a semiconductor substrate of a high impurity concentration and one conductivity type, a second step for forming on the substrate a semiconductor layer of a low impurity concentration and the same conductivity type as that of said substrate, a third step for forming in one side of said semiconductor layer at least one portion of a gate region of a conductivity type opposite to that of said substrate, a fourth step for forming on the side of said semiconductor layer an insulating film with a partial opening, a fifth step for forming in the side of said semiconductor layer the other portion of said gate region of a conductivity type opposite to that of said substrate by introducing an impurity into said semiconductor layer through said opening, said gate region surrounding a part of said semiconductor layer, a sixth step for partially removing said insulating film located over said part of said semiconductor layer surrounded by said gate region, a seventh step for forming in the surface of said part of said semiconductor layer surrounded by said gate region and spaced apart therefrom a source region with a conductivity type opposite to that of said gate region by introducing an impurity into said semiconductor layer through the removed portion of said insulating film, and an eighth step for forming gate electrodes and source electrodes attached to said other portion of said gate region and to said source region respectively, said source electrodes extending across said one portion of said gate region on said insulating film.

2. A manufacturing method according to claim 1, wherein said gate region is formed in the shape of a rectangular frame with one side forming said one portion and three remaining sides forming said other portion, and said source region is formed in the shape of a strip.

3. A manufacturing method according to claim 1, wherein said fifth step includes forming said other portion of said gate region by forming on said insulating film another insulating film doped with said impurity, and heating said another insulating film to diffuse said impurity into said semiconductor layer.

4. A manufacturing method according to claim 3, wherein said sixth step includes partially removing said another insulating film, and said seventh step is a process to form said source region by masking said other portion of said gate region with said another insulating film and diffusing said impurity.

5. A manufacturing method according to claim 1, wherein said fourth step includes a process for forming a first insulating film on portions of said semiconductor layer where said source region and said other portion of said gate region are to be formed afterwards, a process for removing by etching a portion of the surface of said semiconductor layer with said first insulating film as a mask, a process for covering said removed portion with a second insulating film, and a process for forming said opening by removing a portion of said first insulating film on said portion of said semiconductor layer where said other portion of said gate region is to be formed afterwards.

6. A manufacturing method according to claim 5, wherein said first insulating layer is a silicon nitride film, and said second insulating layer is a silicon oxide film.

7. A method according to claim 1, wherein said at least one portion of said gate region is formed with an impurty concentration lower than the other portion of said gate region.

8. A method according to claim 1, wherein said at least one portion of said gate region is formed to a shallower depth in said semiconductor layer than said other portion of said gate region.

9. A method according to claim 1, wherein boron-doped silicon glass (BSG) is used as a diffusion source for said other portion of said gate region.

10. A method for manufacturing a junction field-effect transistor comprising a first step for preparing a semiconductor substrate of a high impurity concentration and one conductivity type, a second step for forming on the substrate a semiconductor layer of a low impurity concentration and the same conductivity type as that of said substrate, a third step for forming in one side of said semiconductor layer one portion of a gate region of a conductivity type opposite to that of said substrate, a fourth step for forming on the side of said semiconductor layer an insulating film with a partial opening, a fifth step for forming in the side of said semiconductor layer the other portion of said gate region of a conductivity type opposite to that of said substrate by introducing an impurity into said semiconductor layer through said opening, said gate region surrounding a part of said semiconductor layer, a sixth step for partially removing said insulating film located over said part of said semiconductor layer surrounded by said gate region, a seventh step for forming in the surface of said part of said semicondctor layer surrounded by said gate region a source region with a conductivity type opposite to that of said gate region by introducing an impurity into said semiconductor layer through the removed portion of said insulating film, and an eighth step for forming gate electrodes and source electrodes attached to said other portion of said gate region and to said source region respectively, said source electrodes extending across said one portion of said gate region on said insulating film, wherein said fourth step includes a process for forming a first insulating film on portions of said semiconductor layer where said source region and said other portion of said gate region are to be formed afterwards, a process for removing by etching a portion of the surface of said semiconductor layer with said first insulating film as a mask, a process for covering said removed portion with a second insulating film, and a process for forming said opening by removing a portion of said first insulating film on said portion of said semiconductor layer where said other portion of said gate region is to be formed afterwards.

* * * * *